(12) United States Patent
Sheen et al.

(10) Patent No.: US 6,603,669 B2
(45) Date of Patent: Aug. 5, 2003

(54) CAPTURE DEVICE FOR BOARDS HAVING VARIABLE THICKNESS

(75) Inventors: Lewis B. Sheen, Shirley, MA (US); Arthur S. Rousmaniere, Andover, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/951,011

(22) Filed: Sep. 12, 2001

(65) Prior Publication Data

US 2003/0048623 A1 Mar. 13, 2003

(51) Int. Cl.[7] ............................. H05K 7/14; H05K 7/18
(52) U.S. Cl. ..................... 361/801; 361/759; 361/756; 361/747
(58) Field of Search ........................ 361/801, 759, 361/740, 732, 726, 747, 756

(56) References Cited

U.S. PATENT DOCUMENTS 5,029,044 A * 7/1991 Novak .................... 174/138 D
5,715,146 A * 2/1998 Hoppal ................... 174/138 G
6,305,966 B1 * 10/2001 Arbogast et al. ........... 439/377

* cited by examiner

Primary Examiner—David Martin
Assistant Examiner—Hung Bui
(74) Attorney, Agent, or Firm—Kudirka & Jobse, LLP

(57) ABSTRACT

A capture device for use with circuit boards of varying thicknesses prevents the spacing between the boards from increasing and has a unitary body including a flexible arm, a clip cavity and multiple living hinges that enable the device to be pivotally self-locked between the circuit boards. The capture device can be engaged and disengaged in poor visibility and limited access areas densely packed with circuit boards. The capture device may be made of a semi-rigid material that provides enough flexibility for the living hinges, yet is rigid enough to exert pressure on the boards and prevent the spacing between the boards from increasing. In alternative embodiments, more than two circuit boards may be secured using alternative configurations of the capture device with either multiple arms or multiple clip cavities.

22 Claims, 4 Drawing Sheets

CAPTURE DEVICE FOR BOARDS HAVING VARIABLE THICKNESS

FIELD OF THE INVENTION

The invention relates to electrical circuit boards, and more specifically, to a capture device for use with circuit boards having variable thickness to prevent the space between the circuit boards from increasing.

BACKGROUND OF THE INVENTION

Computers and other devices that include digital logic components typically employ one or more circuit boards populated with any of small, medium, or large scale logic components, typically in the form of integrated circuits, as well as occasional discrete components. Electrical signals and power are transferred between boards through electrical connectors, typically complimentary mating pin connectors. It is common for a primary circuit board (a mother board) to provide power and signals to a secondary or supplemental circuit board (a daughter board), such as a memory card. In such instances, the electrical connection between the mother board and daughter, board must be maintained in order for the daughter board to function properly. The preferred spacing between the circuit boards, therefore, is defined by the spacing necessary for optimal mechanical and electrical contact between the complimentary electrical connectors on each respective board. Accordingly, the space between the interior or facing surfaces of two connected circuit boards is fairly well defined by the combined profile of the connectors. If the only feature mechanically coupling the mother board to the daughter board is an electrical pin connector, it is possible for the daughter board to work loose or "back-out" from the mother board, particularly since the daughter board may be of smaller size than the mother board. This problem also arises when two similar size boards are mechanically and electrically coupled through only a pin connector. One prior art solution to this problem has been to mechanically secure the boards together using a spacing post, sometimes called a standoff, and screws. However, such devices are sometimes difficult to install and uninstall, particularly when boards are being swapped in existing installed system where space may be very limited. Accordingly, a need exists for a device that mechanically secures a plurality of circuit boards, including mother boards and daughter boards, in a fixed relation to prevent the space between the boards from increasing, i.e. back-out.

In addition, although the space between the interior or facing surfaces of two connected circuit boards is typically defined by the combined profile of the connectors on the circuit boards, the height between the exterior surfaces of the joined boards may vary depending on the thickness of the boards. Current fabrication techniques allow circuit boards to have multiple layers of signal paths therein, increasing the thickness of the boards. As such, the required spacing between the respective non-connecting surfaces of two circuit boards may vary depending on the thickness of the circuit boards to be joined. Accordingly, a need exists for a device that can mechanically clamp two circuit boards together and that can accommodate a variety of spacing distances between the exterior, non-facing surfaces of the boards.

Further, circuit boards are often mechanically and electrically coupled during both assembly of a computer system as well as during upgrading and maintenance of a computer system once assembled. For example, daughter boards that add additional functionality and/or memory to a mother board are often inserted by a field engineer. Typically, the existing space into which the board must be inserted has limited access making it very difficult to use mechanical fasteners, i.e., screws and standoffs to secure circuit boards together. In addition, mechanical coupling of such boards is often done without the benefit of the technician being able to see the boards and components clearly. Accordingly, a need exists for a device that can be used to capture and mechanically join circuit boards with limited access thereto. A further need exists for a device that can be clamped and unclamped from circuit boards using primarily the tactile sense, without the benefit of sight.

SUMMARY OF THE INVENTION

A capture device for use with circuit boards having variable thickness includes a unitary body including a flexible arm, a clip cavity and multiple living hinges that enable the capture device to be pivotally locked between multiple circuit boards whose intermediate spacing height varies. The capture device can be engaged and disengaged in poor visibility and limited access areas with densely packed circuit boards. The capture device may be made of a semi-rigid material that provides enough flexibility for the living hinges, yet is rigid enough to maintain the boards at respective distances. In alternative embodiments, more than two circuit boards may be secured using alternative configurations of the capture device with either multiple arms or multiple clip cavities.

According to a first aspect of the present invention, an apparatus for removably securing multiple circuit boards comprises (a) a main body capable of receiving a first circuit board; (b) a first arm pivotally joined to the main body; and (c) an engaging mechanism formed at an end of the first arm for engaging and removably securing another circuit board in spaced relation to the first circuit board. In one embodiment, the first arm and the main body are joined with a first living hinge. In another embodiment, an elbow is integrally formed in the first arm and joined with a living hinge which forms an angle of less than ninety degrees between the elbow and the first arm. In other embodiments, the capture device further comprises a second arm pivotally joined to the main body and a second engaging mechanism formed at an end of the second arm for engaging and removably securing another circuit board in spaced relation to the first circuit board.

According to a second aspect of the present invention, an apparatus for removably securing multiple circuit boards comprises (a) a main body capable of receiving a first circuit board; (b) a first arm; (c) means for pivotally attaching the first arm to the main body; and (d) engaging means formed at the end of the first arm for engaging and removably securing another circuit board in spaced relation to the first circuit board. In one embodiment, the means pivotally attaching the first arm to the main body comprises a first living hinge. In another embodiment, an elbow is integrally formed in the first arm and joined with a living hinge which forms an angle of less than ninety degrees between the elbow and the first arm. In other embodiments, the capture device further comprises a second arm pivotally joined to the main body and a second engaging mechanism formed at an end of the second arm for engaging and removably securing another circuit board in spaced relation to the first circuit board.

According to a third aspect of the present invention, a method for removably securing multiple circuit boards comprising: (a) providing a capture device comprising: i) a main body capable of removably receiving a circuit board; ii) a first arm pivotally joined to the main body, and iii) an engaging mechanism formed at an end of the arm for engaging and removably securing another circuit board in spaced relation to the first circuit board; (b) engaging a first circuit board with the capture device; and (c) pivoting one of the main body and first arm to engage a second circuit board with the capture device. In another embodiment the method further comprises, applying force on the circuit boards with the capture device to maintain the circuit board in a spaced relation.

BRIEF DESCRIPTION OF THE DRAWINGS

The above and further advantages of the invention may be better understood by referring to the following description in conjunction with the accompanying drawings in that.

DETAILED DESCRIPTION

Referring to FIGS. 1–4, a capture device 10 is shown in accordance with an illustrative embodiment of the invention. Capture device 10 comprises a main body 12 having a clip formed therein and connected to an arm 16. Three "living hinges" or flexible joints facilitate attachment of the capture device 10 securely between multiple circuit boards. In the illustrative embodiment, capture device 10 may be of a unitary design and manufactured by an injection molding process. Materials suitable for use in manufacturing capture device 10 include any rigid or semi-rigid material, such as natural or synthetic resin, including polypropylene and related families of plastic.

Figure 1:
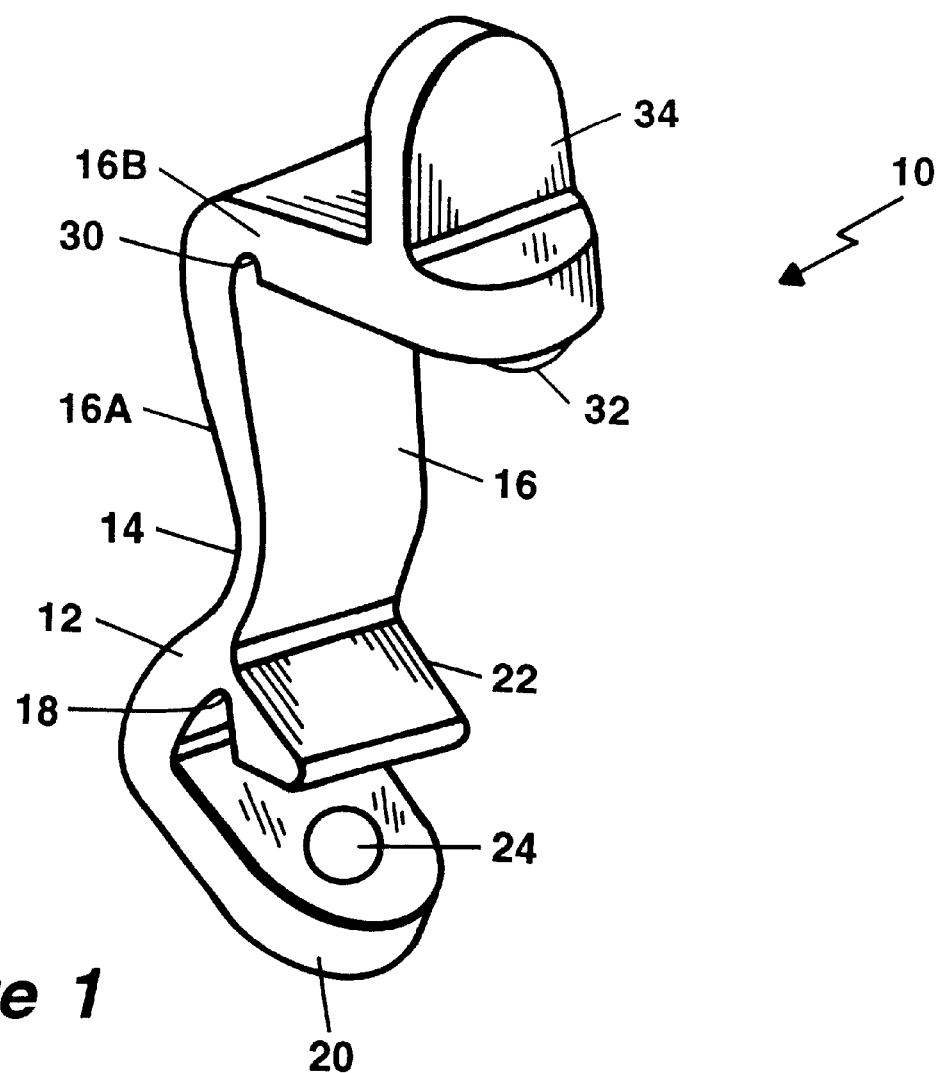
FIG. 1 is a top/side perspective view of the capture device of the present invention.
Figure 3:
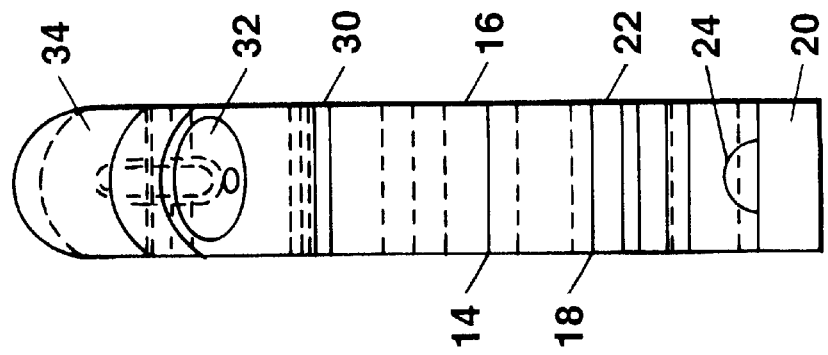
FIG. 3 is a front view of the capture device of FIG. 2.
Figure 2:
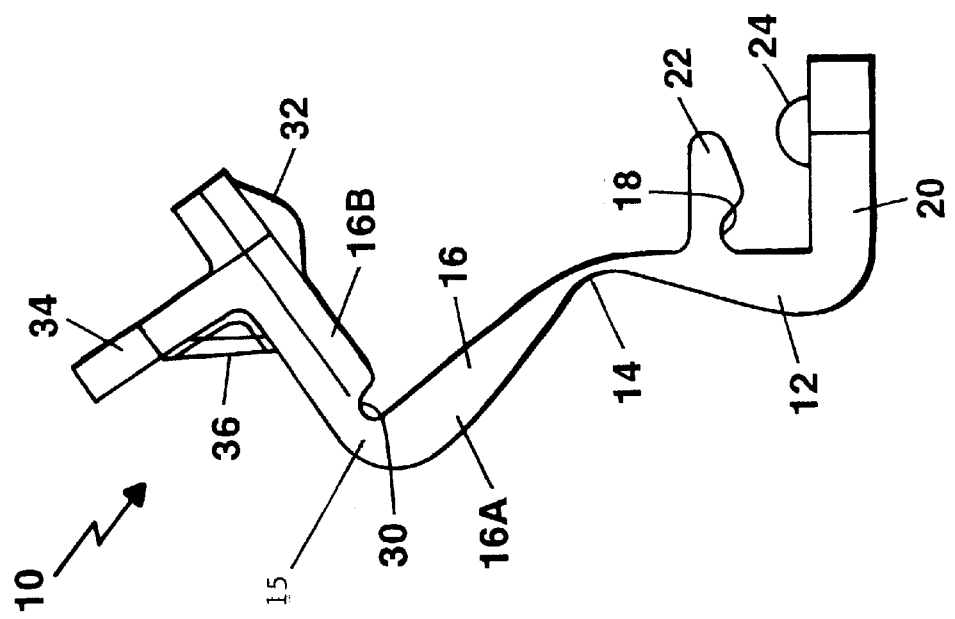
FIG. 2 is a side view of the capture device of FIG. 1.

Referring specifically to FIGS. 1–3, capture device 10 comprises a main body 12 joined to an arm 16 by living hinge 14. The living hinge is implemented with an extreme narrowing of the cross sectional area between arm 16 and main body 12. Living hinge 14 allows arm 16 to bend in relation to main body 12. Main body 12 further comprises a clip cavity formed therein and defined by a clip base 20 and projection 22. A hemispherical nub 24 on the top surface of base clip 20 interacts with the lower ridge portion at the maximum width of projection 22 to form a pinch into which a circuit board may be received and removably secured. As illustrated, the point at which projection 22 is secured to main body 12 includes a second living hinge 18 characterized by a narrowing cross-sectional area that allows projection 22 to bend or flex slightly in relation to main body 12 to receive a circuit board. In the illustrative embodiment, it is contemplated that the circuit board received within the clip cavity formed by clip base 20 and projection 22 has a complimentary shape aperture, depression, or other feature into which nub 24 may be disposed. The lower ridge portion of projection 22 rests on the surface of the circuit board or, alternatively, within a feature, such as a hole or depression, in the circuit board. Living hinge 18 causes projection 22 to apply downward force on the circuit board to maintain the board within the clip cavity of main body 12.

Arm 16 has integrally formed therein an elbow 15 having a living hinge 30 that separates the arm into upper and lower portions 16A and 16B, respectively. In the illustrative embodiment, the angle between the upper and lower portions of arm 16 may be approximately 85° but should be less than ninety degrees (90°) in order to provide appropriate downward force from upper arm portion 28 onto the second circuit board, as explained hereinafter. Extending downward from the bottom portion of upper arm portion 16B is a substantially conical nub 32 with a founded peak which frictionally engages an aperture in a second circuit board once in place. A tab 34 projects from the top surface of upper arm portion 16B and is provided with a support 36. The tab 34 facilitates manual attachment and removal of the capture device 10, from between a pair of circuit boards. Force substantially normal to tab 34 causes device 10 to bend a living hinge 14 allowing arm 16 to pivot in relation to main body 12. Referring to FIG. 3, the end surfaces of clip base 20, as well as upper arm portion 16B and tab 34 are rounded, in the illustrative embodiment.

Figure 4A:
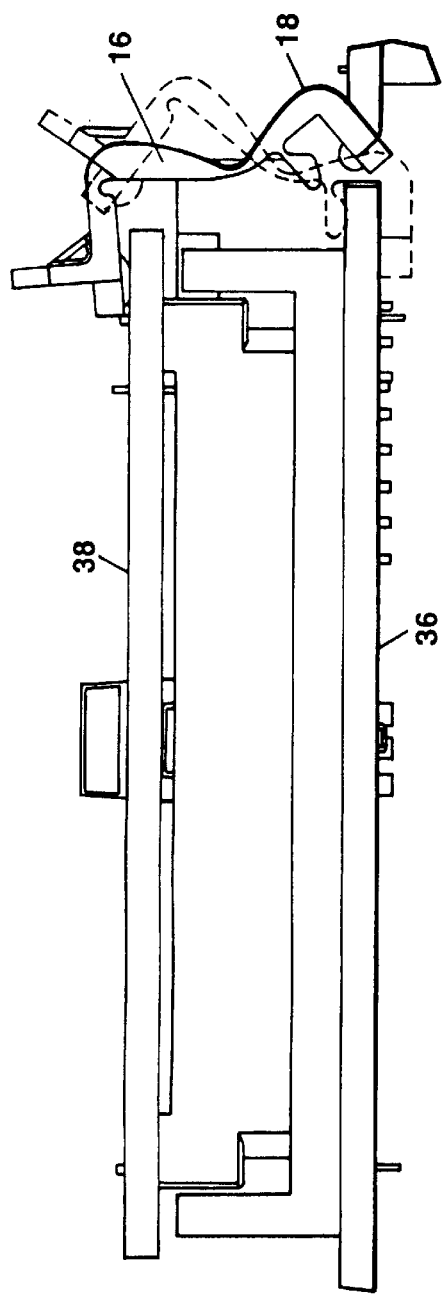
FIGS. 4A–B illustrate configurations of the capture device of FIG. 1 during and after capture of a pair of circuit boards.
Figure 4B:
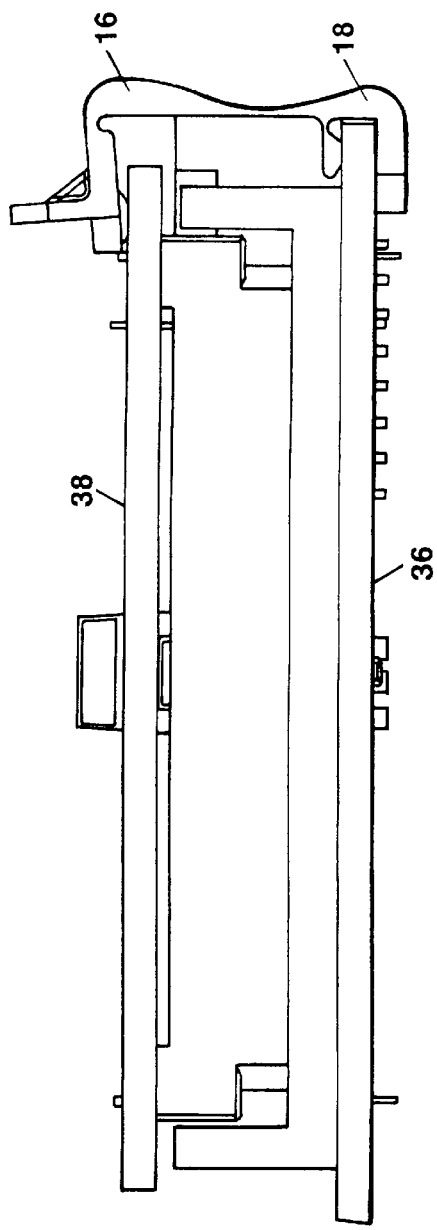

Referring to FIGS. 4A–B, the position of capture device 10 in relationship to a pair of circuit boards 36 and 38 is illustrated during and after capture thereof. Specifically, in FIG. 4A, the device 10 shown in phantom has the clip cavity joined to first board 36 while arm 16 is yet to be joined. The device 10 shown in solid lines is joined to second circuit board 38 while the clip cavity in main body 12 is yet to be joined. As illustrated, either the clip cavity or arm may be used to capture a first of the boards. Thereafter device 10 is pivoted at living hinge 14 to position either of the clip cavity or arm, whichever is still free, to capture a second of the boards, as illustrated in FIG. 4B. Once device 10 is in place, nub 32 of upper portion 16B rests within an aperture, depression or other feature of a circuit board. Because of the displacement angles of upper arm portion 16B relative to lower arm portion 16A, and the living hinge 30 formed therebetween, upper arm portion 16B exerts force against the surface of the circuit board while arm 16 exerts counter force, helping to maintain nub 32 within the aperture, depression or other feature of the other circuit board. Note that the inward clamp-like force exerted on boards 36 and 38 by device 10 prevents the boards from moving apart, however, the device 10 does not secure the boards at a fixed distance or prevent the boards from being moved closer together if necessary.

Figure 5:
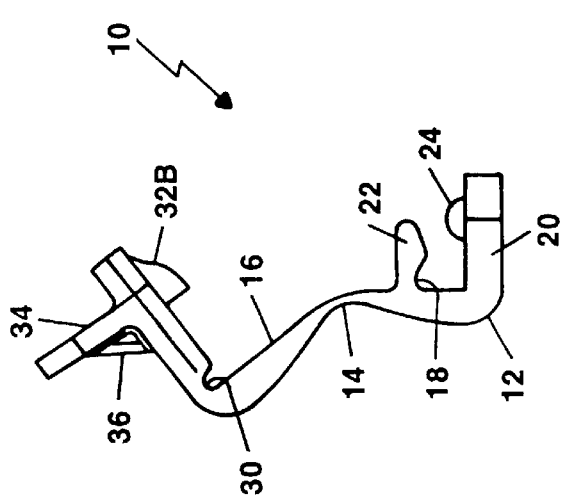
FIG. 5 is a side view of an alternative embodiment of the inventive capture device of FIG. 1.

It will be obvious to those reasonably skilled in the art that the size and shape of nubs 24 and 32, as well as projection 22 may vary according to the designer's discretion so long as the shapes are compatible with the features in the circuit boards into which the nubs and/or projections are received. For example, FIG. 5 illustrates an alternative embodiment of the capture device 10 in which the conical nub 32, extending downward from the bottom surface of upper arm portion 16B in FIG. 1, has been replaced with a projection 32B that frictionally engages a second circuit board once in place. The projection 32B has a profile similar to a ratchet tooth, instead of a cone. Otherwise, all other aspects of capture device 10 may be the same as illustrated in FIG. 1 described herein.

Figure 6:
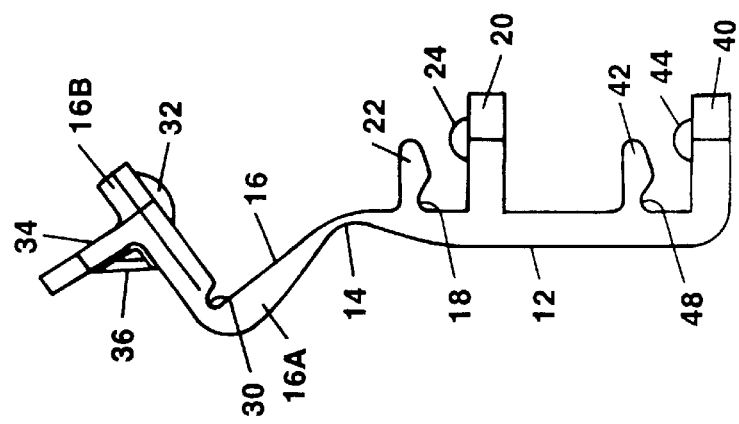
FIG. 6 is a side view of an another alternative embodiment of the inventive capture device.

Referring specifically to FIG. 6, an alternative embodiment of the capture device 10 is illustrated. In FIG. 6, capture device 10 comprises a main body 12 joined to an arm 16 by living hinge 14, similar to that illustrated in FIG.

1. However, main body 12 includes a second clip cavity defined by base clip 40 and projection 42. A hemispherical nub 44 on base clip 40 interacts with the ridge at the maximum width of projection 42 to form a pinch into which a circuit board may be received and removably secured. As illustrated, the point at which projection 42 is secured to main body 12 includes a fourth living hinge 48 characterized by a narrowing of the cross-sectional area that allows projection 42 to bend or flex slightly in relation to main body 12 to receive a circuit board. In the illustrative embodiment, it is contemplated that the circuit board received within the second clip cavity formed by clip base 40 and projection 42 also has an aperture, depression or other feature into which nub 44 may be disposed. The lower ridge portion of projection 42 rests on the surface of the circuit board. Living hinge 48 causes projection 42 to apply force on the circuit board to maintain the board within the second clip cavity of main body 12. Otherwise, all other aspects of capture device 10 may be the same as illustrated in FIG. 1 and as described herein. The embodiment of capture device 10 illustrated in FIG. 6 may be used to removably secure three circuit boards in which the distance between at least two adjacent circuit boards is variable. Alternatively, capture device 10 of FIG. 6 may removably secure two circuit boards in which the distance between the circuit boards is greater than the distance that can be accommodated by the first clip cavity defined by a clip base 20 and projection 22.

In an alternative embodiment of the capture device 10 illustrated in FIG. 6, a plurality of clip cavities may be formed into main body 12. In such embodiment, the clip cavities may be implemented with a clip base, projection and living hinge, as previously described with reference to FIG. 1. Such an embodiment may be used to removably secure multiple circuit boards in which the distance between at least two end adjacent circuit boards is variable, or, alternatively, to removably secure two circuit boards by selecting the clip cavity that most closely matches the distance between the circuit boards.

Figure 7:
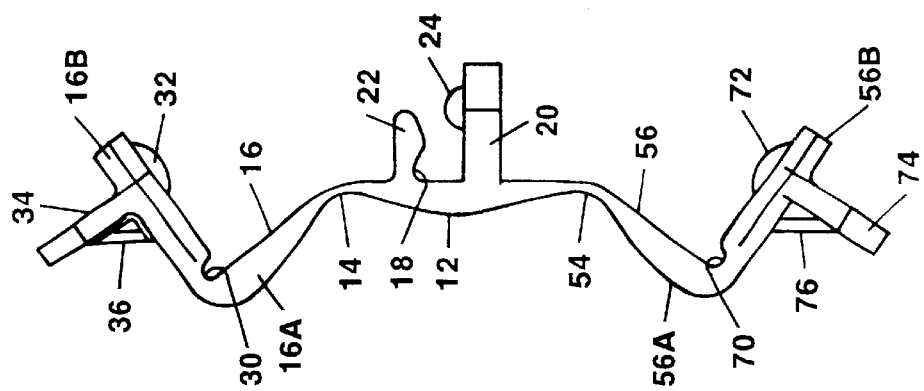
FIG. 7 is a side view of yet another alternative embodiment of the inventive capture device.

Referring specifically to FIG. 7, another alternative embodiment of capture device 10 is illustrated. In FIG. 7, capture device 10 comprises a main body 12 joined to an arm 16 by living hinge 14, similar to that illustrated in FIG. 1. However, main body 12 includes second arm 56 joined by living hinge 54. Living hinge 54 allows arm 56 to bend in relation to main body 12. Arm 56 has integrally formed therein a living hinge 70 that separates the arm into lower and upper portions 56A and 56B, respectively. In the illustrative embodiment, the angle between the upper and lower portions of arm 56 may be approximately 85° but is typically less than 90° in order to provide appropriate downward force from upper arm portion 56B onto the second circuit board, as explained hereinafter. Extending downward from the lower surface of upper arm portion 56B is a substantially conical nub 72 that frictionally engages a third circuit board once in place. A tab 74 projects from a surface of upper arm portion 58B and is provided with a support 76. The tab 74 facilitates manual attachment and removal of the capture device 10 from multiple circuit boards. Otherwise, all other aspects of capture device 10 may be the same as illustrated in FIG. 1 and as described herein. The embodiment of capture device 10 illustrated in FIG. 7 may be used to removably secure three circuit boards in which the distance between at least two adjacent circuit boards relative to the center circuit board is variable.

Having described herein illustrative embodiments of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not by the particular features that have been shown and described, but shall be construed also to cover any obvious modifications and equivalents thereof.

What is claimed is:

1. An apparatus for removably securing multiple circuit boards comprising:

(a) a main body capable of receiving a first circuit board;
 (b) a first arm extending from the main body, the first arm capable of pivoting in relation to the main body; and
 (c) an engaging mechanism formed at an end of the first arm for engaging and removably securing another circuit board in spaced relation to the first circuit board;
 the first arm and the main body are joined with a living hinge.

2. The apparatus of claim 1 further comprising:
 a receiving mechanism joined to the main body for receiving and removably securing the first circuit board to the main body.

3. The apparatus of claim 1 further comprising:
 (d) an elbow integrally formed in the first arm.

4. The apparatus of claim 3 wherein the elbow and the first arm are joined with a living hinge.

5. The apparatus of claim 4 wherein the living hinge joining the first arm and the elbow forms an angle of less than ninety degrees between the elbow and the first arm.

6. The apparatus of claim 1 further comprising:
 (d) a second receiving mechanism joined to the main body for receiving and removably securing a circuit board.

7. The apparatus of claim 1 further comprising:
 (d) a second arm extending from the main body, the second arm capable of pivoting in relation to the main body;
 (e) a second engaging mechanism formed at an end of the second arm for engaging and removably securing another circuit board in spaced relation to the first circuit board.

8. The apparatus of claim 7 further comprising:
 (f) an elbow integrally formed in the second arm, the second arm and the bow joined with a living hinge.

9. The apparatus of claim 8 wherein the living hinge joining the second arm and the elbow forms an angle of less than ninety degrees between the elbow and the second arm.

10. The apparatus of claim 7 wherein the second arm and the main body are joined with a living hinge.

11. An apparatus for removably securing multiple circuit boards comprising:

(a) a main body capable of receiving a first circuit board;
 (b) a first arm;
 (c) means for pivotally joining the first arm to the main body;
 (d) engaging means formed at the end of the first arm for engaging; and removably securing another circuit board in spaced relation to the first circuit board;
 the means for pivotally joining the first arm and the main body comprises a first living hinge.

12. The apparatus of claim 11 further comprising:
 (e) receiving means joined to the main body for receiving and removably securing the first circuit board to the main body.

13. The apparatus of claim 11 further comprising:
(e) an elbow integrally formed with the first arm, the elbow and first arm joined with a living hinge.

14. The apparatus of claim 13 wherein the living hinge joining the first arm and the elbow forms an angle of less than ninety degrees between the elbow and the first arm.

15. The apparatus of claim 11 further comprising:
(e) a second receiving means joined to the main body for receiving and removably securing another circuit board.

16. The apparatus of claim 11 further comprising:
(e) a second arm;
(f) means for pivotally joining the second arm to the main body;
(g) a second engaging mechanism formed at an end of the second arm for engaging and removably securing another circuit board in spaced relation to the first circuit board.

17. The apparatus of claim 16 further comprising:
(h) an elbow integrally formed in the second arm, the second arm and the elbow joined with a living hinge.

18. The apparatus of claim 17 wherein the living hinge joining the second arm and the elbow forms an angle of less than ninety degrees between the elbow and the second arm.

19. A method for removably securing multiple circuit boards comprising:
(a) providing a capture device comprising:
(i) a main body capable of removably receiving a circuit board,
(ii) a first arm pivotally joined to the main body,
(iii) an engaging mechanism formed at an end of the first arm for engaging and removably securing a circuit board in spaced relation to another circuit board,
(iv) a second arm pivotally joined to the main body; and
(v) a second engaging mechanism formed at an end of the second arm for engaging and removably securing a circuit board in spaced relation to the another circuit board;
(b) engaging a first circuit board with the capture device;
(c) pivoting one of the main body and first arm to engage a second circuit board with the capture device; and
(d) engaging a third circuit board with the capture device.

20. The method of claim 19 further comprising:
(d) applying force on the circuit boards with the capture device to maintain the circuit board in a spaced relation.

21. A method for removably securing multiple circuit boards comprising:
(a) providing a capture device comprising:
(i) a main body capable of receiving a circuit board,
(ii) a first arm extending from the main body and pivotally joined to the main body with a living hinge, and
(iii) an engaging mechanism formed at an end of the first arm for engaging and removably securing a circuit board in spaced relation to the other circuit board;
(b) engaging a first circuit board with the capture device; and
(c) pivoting one of the main body and first arm to engage a second circuit board with the capture device.

22. The method of claim 21 further comprising:
(d) applying force on the circuit boards with the capture device to maintain the first and second circuit boards in a spaced relation.

* * * * *

UNITED STATES PATENT AND TRADEMARK OFFICE
CERTIFICATE OF CORRECTION

PATENT NO.    : 6,603,669 B2
DATED         : August 5, 2003
INVENTOR(S)   : Lewis B. Sheen and Arthur Rousmaniere It is certified that error appears in the above-identified patent and that said Letters Patent is hereby corrected as shown below:

<u>Column 6</u>
Line 46, please replace "and the bow joined" with -- and the elbow joined --

Signed and Sealed this

Fourth Day of November, 2003

JAMES E. ROGAN
*Director of the United States Patent and Trademark Office*